United States Patent Office 3,099,558
Patented July 30, 1963

3,099,558

PHOTOPOLYMERIZATION OF VINYL MONOMERS BY MEANS OF A RADIATION ABSORBING COMPONENT IN THE PRESENCE OF A DIAZONIUM COMPOUND

Steven Levinos, Vestal, N.Y., assignor to General Aniline & Film Corporation, New York, N.Y., a corporation of Delaware No Drawing. Filed June 26, 1959, Ser. No. 823,005
20 Claims. (Cl. 96—35)

This invention relates to the photopolymerization of monomeric vinyl compounds while employing as a catalyst therefor a mixture of a radiation absorbing component and a diazonium compound to polymers obtained therefrom and to photographic elements based thereon.

It is well known that certain unsaturated organic compounds when exposed to light undergo slow polymerization to a hardened plastic mass. Such light sensitive materials have been utilized in photography and the related fields of photolithography for the production of polymeric photographic images. Thus, a layer of a light sensitive polymerizable compound on exposure to an optical image undergoes polymerization in the irradiated areas. After removal of the unpolymerized material corresponding to the unexposed areas, there is obtained a polymeric photographic relief image.

One of the major difficulties in effecting the photopolymerization of unsaturated organic compounds is the inordinately long exposures to high energy radiation sources in order to obtain polymers of sufficient toughness and film strength. Although there have been proposals for the use of sensitizers to increase the speed of such light sensitive photopolymerizable systems, the prior art has not as yet achieved rapid photopolymerization by means of low energy radiation sources. Thus, in a recent patent, U.S.P. 2,831,768, issued April 22, 1958 are disclosed certain light sensitive polyvinyl aryl phenones having increased photographic speed. In Example 1 of this patent, a coating comprising a light sensitive aryl phenone was exposed for two minutes at a distance of 10 inches from a sun lamp in order to produce a photographic relief image. Other photopolymerization systems currently in vogue require correspondingly long periods of exposure to high intensity radiation sources.

It is, therefore, believed to be manifest that a need exists in the photographic and kindred arts for a photopolymerization system having increased speed of response to the exposing radiation.

Accordingly, an important object of this invention is to provide a method of producing polymers by the rapid photopolymerization of unsaturated organic compounds.

Another object of the invention is to provide a method for the rapid photopolymerization of monomeric vinyl compounds wherein a mixture of a radiation absorbing component and a diazonium compound is employed as a radiation sensitive catalyst for said photopolymerization while using relatively low intensity radiation.

Another object of the invention is to provide sensitized compositions capable of rapid polymerization on exposure to low intensity radiation.

A further object is to provide superior light sensitive material for use in making printing plates, stencils, transfer materials, printed circuits, etc.

Other objects will become apparent as the description proceeds.

It has now been discovered that the photopolymerization of polymerizable unsaturated organic compounds such as vinyl monomers can be accomplished in essentially short periods of time while employing as the catalyst for said photopolymerization a mixture of a radiation absorbing dye and a diazonium compound.

By a radiation absorbing component, I mean those types of compounds the molecules of which are efficient absorbers of radiation particularly ultraviolet and visible radiation. According to modern theories of structure and resonance, the phenomenon of absorption of radiation is associated with vibrations of electrons in the molecule responsive to stimulation by rays of a specific oscillation frequency. If the electrons are firmly bound, they will respond to those radiations characterized by a rather high frequency and of greater energy. However, as the electrons become mobile, such as by an increase in the conjugation within the molecule, they are more readily set to vibrating. As the mobility of electrons is further increased, radiation having less energy content, i.e., rays of longer wave length, will suffice to set the electrons to oscillating and the molecules of the particular material are then said to absorb in the visible part of the spectrum.

I have found that, in general, organic dyes of the type having high tinctorial strength, i.e., efficient absorbers of radiant energy, are eminently suitable as the radiation absorbing component to be used in combination with a diazonium compound for use as a photopolymerization catalyst. By high tinctorial strength I mean having a high intensity of absorption of the exposing radiation.

Particularly suitable as radiation absorbers for practicing the invention are the sensitizing dyes of the type commonly employed for the optical sensitization of silver halide photographic emulsions. These dyes are efficient absorbers of radiant energy and, furthermore, representatives may be selected having a wide spectral range extending from the ultraviolet region to far out into the infrared portion of the electromagnetic spectrum. Thus, by suitable choice of the sensitizing dye, I have been able to bring about my photopolymerization reactions employing a wide variety of radiations such as ultraviolet light, visible light and infrared rays.

Sensitizing dyes which I have found to produce excellent results include the cyanines, merocyanines, azanols, oxanols, hemicyanines, styryl dyes and the like.

Sensitizing dyes of the aforesaid classes are known chemical entities and are described at great length in the chemical literature. In this connection, reference is made to such well known works as the Theory of the Photographic Process, chapter XI, revised edition, by C. E. Kenneth Mees, 1954 and published by the Macmillan Company. However, for a more detailed description of these dyes including their preparation, reference is made to the following U.S. patents and publication:

*Cyanines*

| | |
|---|---|
| 2,068,047 | 2,255,128 |
| 2,089,322 | 2,292,021 |
| 2,131,853 | 2,320,439 |
| 2,131,864 | 2,354,524 |
| 2,152,615 | 2,443,136 |
| 2,158,287 | 2,526,632 |

*Merocyanines*

| | |
|---|---|
| 2,161,331 | 2,493,747 |
| 2,185,182 | 2,496,899 |
| 2,186,624 | 2,515,913 |
| 2,482,532 | 2,553,494 |
| 2,490,572 | |

*Azanols*

2,500,111
2,578,178

*Oxanols*

| | |
|---|---|
| 2,073,759 | 2,514,649 |
| 2,241,238 | 2,533,206 |

*Hemicyanines*

| | |
|---|---|
| 2,166,736 | 2,304,981 |
| 2,263,749 | 2,369,509 |
| 2,275,024 | |

*Styryl Dyes*

| | |
|---|---|
| 1,994,170 | 2,494,032 |
| 2,230,789 | 2,504,617, and |
| 2,280,253 | JACS 67, 1876–77 (1945) |
| 2,385,747 | |

Other references include J. Frank Inst., 1935, 219:255 and Z.w.P., 1935, 34:245.

In the following list are typified various sensitizing dyes for the purpose herein set forth:

*Cyanines*

5-chloro-1',3-diethyl-6'-methylthia-2'-cyanine iodide
3,3'-diethylthiacyanine iodide
1,3'-diethylthia-2'-cyanine iodide
1',2-diethyloxa-2'-cyanine iodide
1',2-diethylselena-2'-cyanine bromide
1,1'-dimethyl-2'-pyrido-2'-cyanine iodide
1',3-diethylthiazolo-2'-cyanine iodide
1',3-diethyl-4-phenylthiazolo-2'-cyanine iodide
1',3-diethyl-5-phenylthiazolo-2'-cyanine iodide
3,3'-dimethylthiazolocyanine iodide
3,3'-diethyloxazolocyanine iodide
3,3'-dimethyl-4,4'-diphenyloxacyanine iodide
1',3-diethyl-4-methylselenazolocyanine iodide
3,3'-dimethylthiazolinocyanine iodide
3,3'-diethylselenazolinocyanine iodide
1',3-diethyl-4-phenyl-5',6'-benzothiazolocyanine bromide
3,3'-diethylthiacarbocyanine iodide
8-ethyl-3,3'-dimethylthiacarbocyanine bromide
3,3'-dimethyl-9-methylthiacarbocyanine iodide
3,3',9-triethyl-5,5'-diphenyloxacarbocyanine iodide
3-ethyl-3',4',5,6-tetramethyloxathiazolocyanine iodide
3,3'-di-n-propylthiacarbocyanine iodide
3,3'-9-triethylthiacarbocyanine iodide
3,3'-dimethyl-9-phenylthiacarbocyanine iodide
3,3'-diethylthiazolocarbocyanine iodide
3,3'-dimethyloxazolocarbocyanine perchlorate
3,3'-diethylselenacarbocyanine iodide
1',3-diethylthia-2'-cyanine iodide
1',3-diethyloxa-4'-cyanine iodide
3,3'-diethyloxathiacarbocyanine iodide
1,3'-diethyl-3,3-dimethylindothiacarbocyanine iodide
3'-ethyl-3,3-dimethyl-1-phenyl-4',5'-benzoindothiacarbocyanine iodide
1-ethyl-3,3,3',3'-tetramethyl-1'-phenylindocarbocyanine perchlorate
3,3'-diethyl-4',5'-benzooxathiacarbocyanine iodide
3,3'-diethylthiadicarbocyanine iodide
10-bromo-3,3'-diethylthiadicarbocyanine iodide
1,1'-diethyl-2,2'-dicarbocyanine iodide
3,3'-diethyl-5,6,5',6'-tetramethoxydicarbocyanine iodide
3,3'-dimethyloxadicarbocyanine iodide
5,5'-diethoxy-3,3'-diethyl-6,6'-dimethylthiadicarbocyanine iodide
1',3-diethylthia-2'-dicarbocyanine iodide
3,3'-diethyl-5,6-dimethylselenathiadicarbocyanine iodide
1',3-diethyl-5-methoxy-6'-methylselena-2'-dicarbocyanine iodide
1',3,4-trimethylthiazolo-4'-dicarbocyanine iodide
3,3'-diethyl-9,11-trimethylenethiadicarbocyanine iodide
3,3'-diethyloxatricarbocyanine iodide
3,3'-diethyl-5,6-benzooxatricarbocyanine iodide
3,3'-diethylselenatricarbocyanine iodide
1',3-diethylthia-2'-tricarbocyanine iodide
1',3-diethylselena-2'-tricarbocyanine iodide
3-ethyl-5-methoxy-3'-methyl-4-phenylselenathiatricarbocyanine iodide
1',3-diethyl-5-diethylaminothia-4'-tricarbocyanine perchlorate 3,3'-diethyl-6,7-tetramethylenethiatricarbocyanine iodide
6-acetamido-1',3-diethylthia-2'-tricarbocyanine bromide
1',3-diethyl-5,6,6',10-tetramethylthia-2'-tricarbocyanine perchlorate
5-ethoxy-3-ethyl-3',4',10-trimethylselenathiatricarbocyanine perchlorate
12-acetoxy3,3'-dimethyl-6,6'-diphenylthiatetracarbocyanine perchlorate
12-acetoxy-3,3',5,5'-tetramethylselenatetracarbocyanine perchlorate
12-acetoxy-1,1,1',1',3,3'-hexamethylindotetracarbocyanine chloride
12-acetoxy-1,1'-dimethyl-4,4'-tetracarbocyanine perchlorate
12-acetoxy-5,6,5',6'-tetraethoxy-3,3'-diethylthiatetracarbocyanine perchlorate
12-acetoxy-1,1'-dimethyl-2,2'-tetracarbocyanine perchlorate
12-acetoxy-3,3'-diethylthiapentacarbocyanine perchlorate
12-acetoxy-3,3'-diethyl-6,7,6',7'-dibenzothiapentacarbocyanine perchlorate
12-acetoxy-1,1'-diethyl-2,2'-pentacarbocyanine perchlorate

*Merocyanines*

5-(3-ethyl-2(3)-benzothiazolylidene)-3-phenylrhodanine
5-(3-ethyl-2(3)-benzoxazolylidene)rhodanine
5-(3-allyl-2(3)-benzothiazolylidene)-3-phenylrhodanine
5-(3-ethyl-2(3)-benzothiazolylidene)-2,4-thiazolidinedione
5-(3-allyl-2(3-benzothiazolylidene)-2-thio-2,4-thiazolidinedione
1-ethyl-5-(1-ethyl-2(1)-quinolylidene)-2,4-imidazolidinedione
5-(1-ethyl-2(1)-quinolylidene)rhodanine
3-ethyl-5-(3-ethyl-2(3)-benzothiazolylidene)-1-phenyl-2-thiohydantoin
3-p-dimethylaminophenyl-5-[2-(1-ethyl-2(1)-quinolylidene)ethylidene]rhodanine
3-ethyl-5-[2-(3-ethyl-2(3)-benzoxazolylidene)ethylidene] rhodanine
3-allyl-5-[1-ethyl-2-(3-ethyl-2(3)-benzothiazolylidene) ethylidene]rhodanine
3-ethyl-5-[(3-ethyl-2(3)-benzothiazolylidene)isopropylidene]rhodanine
4-carboxy-3-[(3-ethyl-2(3)-benzothiazolylidene)ethylidene]-6-hydroxy-2(1)-pyridone
5-[(3-ethyl-2(3)-benzoxazolylidene)ethylidene]-3-ethyl-2-thiooxazolylidenedione
3-allyl-5-[(3-ethyl-2(3)-benzoxazolylidene)ethylidene] 1-phenyl-2-thiohydantoin
3-allyl-5-[(3-ethyl-2(3)-benzoxazolylidene)ethylidene] rhodanine
3-carboxymethyl-5-[(3-methyl-2(3)-thiazolinylidene)-2-ethylidene]rhodanine
3-ethyl-5-[4-3-β-phenoxyethyl-2(3)-benzothizolylidene)-2-butenylidene]rhodanine
3-ethyl-5-[4-(3-β-phenoxyethyl-6-methoxy-2(3)-benzoselenazolylidene)-2-butenylidene]rhodanine
3-ethyl-5-[4-(3-β-phenoxyethyl-2(3)-benzothiazolylidene)-2-butenylidene]-1-phenyl-2-thiohydantoin
3-methyl-5-[4-(3-β-phenoxyethyl-2(3)-benzothiazolylidene)-2-butenylidene-1-phenyl-5-pyrazolone
3-p-carboxyphenyl-5-[4-(3-ethyl-2(3)-benzoxazolylidene) 2-butenylidene]rhodanine
3-p-carboxyphenyl-5-[4-(3-ethyl-2(3)-benzoxazolylidene) 2-butenylidene]rhodanine
3-ethyl-5-[6-(3-ethyl-2(3)-benzothiazolylidene)-2,4-hexadienylidene
3-ethyl-5-[6-(3-ethyl-2(3)-benzothiazolylidene)-2,4-hexadienylidene]-2-thiooxazolidenedione
3-ethyl-5-[6-ethyl-4-phenyl-2(3)-thiazolylidene)-2,4-hexadienylidene]rhodanine
3-ethyl-5-[6-(1-ethyl-1(4)-quinolylidene)-2,4-hexadienylidene]rhodanine

*Azanols and Oxanols*

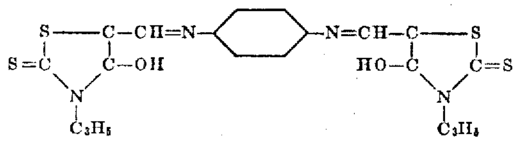

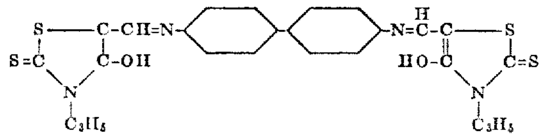

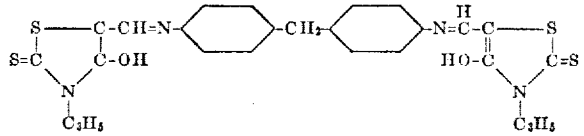

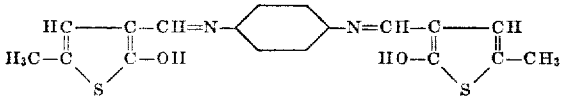

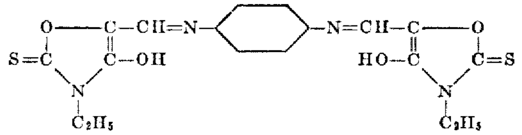

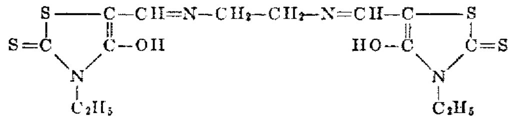

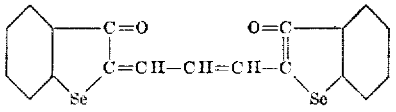

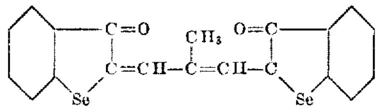

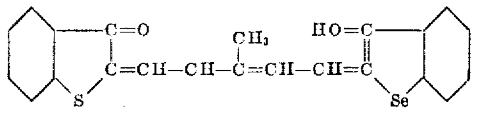

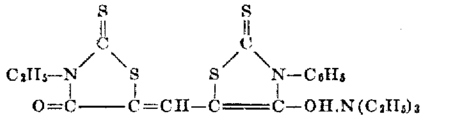

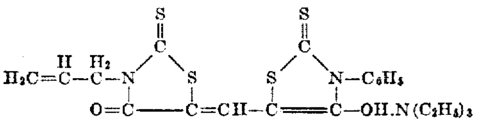

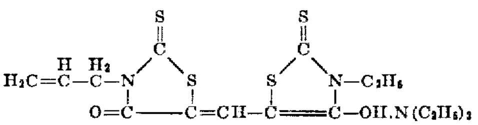

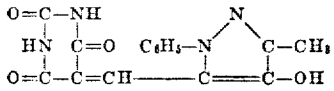

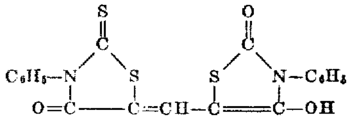

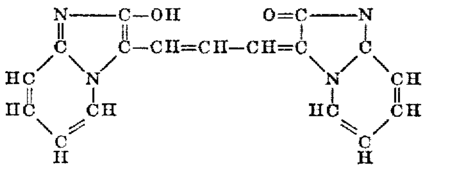

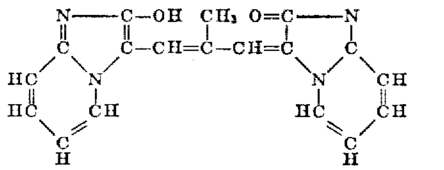

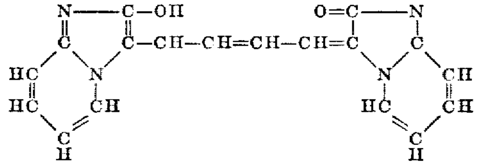

*Hemicyanines*

3-ethyl-2-[2-(4-morpholyl)vinyl]benzoxazolium iodide
3-ethyl-5,6-dimethyl-2[2-(1-piperidyl)vinyl]benzoxazolium iodide
3-ethyl-2-[2-(1-piperidyl)vinyl]thiazolium iodide
3-ethyl-2-[2-(1-piperidyl)vinyl]selenazolium iodide
3-ethyl-2-[2-(1-piperidyl)vinyl]naphtho[1,2-d]thiazolium iodide
1-ethyl-2-[2-(1-piperidyl)vinyl]quinolinium iodide
2-[4-(1-piperidyl)-1,3-butadienyl]benzothiazolium iodide
3-ethyl-2-[4-(4-morpholyl)-1,3-butadienyl]benzothiazolium iodide
2-(4-dibutylamino-1,3-butadienyl)-3-ethylbenzothiazolium iodide
3-ethyl-2-[4-(6-methoxy-4-morpholyl)-1,3-butadienyl] benzothiazolium iodide
3-ethyl-2-(4-diethylamino-1,3-butadienyl)benzoselenazolium iodide
3-ethyl-2-[6-(1-piperidyl)-2,4,6-hexatrienyl]benzothiazolium iodide
3-ethyl-2-[6-(4-morpholyl)-2,4,6-hexatrienyl]benzothiazolium iodide
3-ethyl-2-[4-(o-toluino)-1,3-butadienyl]benzothiazolium iodide
2-(4-anilino-1,3-butadienyl)-3-ethylbenzoxazolium iodide
2-(4-anilino-1,3-butadienyl)-3-ethylbenzoselenazolium iodide
3-ethyl-2-(6-anilino-2,4,6-hexatrienyl)benzothiazolium iodide

*Styryls*

1-ethyl-2,4-di(p-dimethylaminostyryl)pyridinium halide
2,4-di[4-(p-dimethylaminophenyl)-1,3-butadienyl]-1-ethyl-pyridinium iodide
2-[p-(N-$\beta$-cyanoethyl-N-methyl)styryl]-5-methoxy-1,3,3-trimethylindolinium chloride
3-(2-benzothiazolylmethyl)-2-(p-dimethylaminostyryl) benzothiazolium p-toluenesulfonate
2-p-dimethylaminostyryl-3-ethylbenzothiazolium iodide
2-p-dimethylaminostyryl-3-ethyl-5-methyl-1,3,4-thiadiazolium iodide
2-p-dimethylaminostyryl-3-ethylphenanthro[9,10]thiazolium iodide
2-p-dimethylaminostyryl-3-ethyl-4-methylthiazolium iodide
4-p-dimethylaminostyryl-1-ethylpyridinium iodide 3-benzyl-2-p-dimethylaminostyrylbenzothiazolium iodide
2-p-dimethylaminostyryl-3-ethylbenzoxazolium iodide
2-p-dimethylaminostyryl-3-ethyl-4,5-dihydrothiazolium iodide
2-p-dimethylaminostyryl-3,3-dimethyl-1-phenylpseudoindolium perchlorate
2-p-dimethylaminostyrylbenzothiazole
6-methoxy-1-methy-2-m-nitrostyrylquinolinium bromide
8-cyano-5-methyl-2-m-nitrostyrylbenzimidazole Typical coupling components which form azo dyes when coupled with the later listed diazotized aromatic amines are the following:

4-stearoylacetamido-benzene-sulfonic acid
3-(myristoylacetamido)-isophthalic acid
3-(p-benzoylacetamidobenzamido)-5-stearoylamido-p-toluenesulfonic acid
1-(3'-carboxyphenyl)-3-heptadecyl-5-pyrazolone
1-(3'-carboxyphenyl)-3-undecyl-5-pyrazolone
1-(2'-methoxy-4'-sulfophenyl)-3-heptadecyl-5-pyrazolone
1-(3'-stearylaminophenyl)-3-methyl-5-pyrazolone
1(-3'-stearylaminophenyl)-3-methyl-5-pyrazolone
3-benzoylacetamido-4-(N-methyloctadecylamino)-benzoic acid
4-(p-stearoylamidobenzoylacetamido)-phenylglycine
4-(m-stearylamidobenzoylacetamido)-benzoic acid
3-acetoacetamido-4-(N-methyloctadecylamido)-benzoic acid
3-(propioacetamidobenzamido)-5-myristamido-p-toluenesulfonic acid
1-(sulfophenyl)-3-methyl-pyrazolone-5
1,8-dihydroxynaphthalene-3,6-disulfonic acid
1-benzoylamino-8-hydroxynaphthalene-3,6-disulfonic acid
Resorcinol
Resorcinol-5-sulfonic acid
Phloroglucinol
Phloroglucinol carboxylic acid
2,2',4,4'-tetrahydroxy-biphenyl
p-Sulfo-acetoacetanilide
2,4,4'-trihydroxy-biphenyl-2'-sulfonic acid
3-carboxy-1-(4'-sulfophenyl)-5-pyrazolone
N-$\beta$-hydroxyethylresorcylamide
3-carboxy-1(3-stearamidophenyl)-5-pyrazolone
N-[8-(2-hydroxy-3,6-disulfonaphthyl)]-3-stearamido-benzamide
3-(p-stearoylamidobenzoylacetamido)-isophthalic acid Aromatic amines which can be diazotized to yield azo dyes as described above are typified in the following list:

4-amino caprylanilide (or 4-caprylamido aniline)
5-stearamido orthanilic acid
5-lauramido anthranilic acid
3-amino-4-methoxydodecanesulfonanilide
4-diethylaminoaniline
2-ethoxy-4-diethylaminoaniline
5-dimethylamino orthanilic acid
4-(di-$\beta$-hydroxyethylamino)aniline
4-cyclohexylaminoaniline
4-piperidinoaniline
4-thiomorpholinoaniline
4-hydroxyaniline
3-methyl-4-ethylaminoaniline
4-aminodiphenylamine
3-methyl-4-($\beta$-hydroxyethylamino)aniline
5-amino salicylic acid
o-pentadecoxyaniline
N-$\beta$-hydroxyethyl-N-ethyl-p-phenylene diamine
Benzidine-2,2'-disulfonic acid
Benzene-2,2'-disulfonic acid
2,5-dichloro-1-amino-benzene
4-chloro-2-amino-1-methylbenzene
4-chloro-2-amino-1-methoxy benzene
2,5-dichloro-1-methyl-4-aminobenzene
3-chloro-1-aminobenzene 2,5-dichloro-1-aminobenzene
2-amino-4-methoxy-5-benzoylamino-1-chlorobenzene
2,5-dichloro-4-amino-1-methylbenzene
4,6-dichloro-2-amino-1-methylbenzene
4-amino-1,3-dimethylbenzene
4,5-dichloro-2-amino-1-methylbenzene
5-nitro-2-amino-1-methylbenzene
5-nitro-2-amino-1-methoxybenzene
3-amino-4-methoxy-6-nitro-1-methylbenzene
3-amino-4-methoxy-6-benzoylamino-1-methylbenzene
6-amino-4-benzoylamino-1,3-dimethoxybenzene
6-amino-4-benzoylamino-1,3-dimethoxy-diphenyl
6-amino-3-benzoylamino-1,4-diethoxybenzene
6-amino-3-benzoylamino-4-ethoxy-1-methoxybenzene
6-amino-3-benzoylamino-1,4-dimethoxybenzene
p-Amino-diphenylamine
p-Phenylenediamine-monosulfo acid
N-$\beta$-hydroxyethyl-N-methyl-p-phenylenediamine
N-$\beta$-hydroxyethyl-N-ethyl-p-phenylenediamine
p-Ethylamino-m-toluidine
p-Diethylamino-aniline
p-Dimethylamino-aniline
N-benzyl-N-ethyl-p-phenylenediamine
p-Dimethylamino-o-toluidine
p-Diethylamino-o-phenetidine
4-benzoylamino-2,5-diethoxyaniline
2-amino-5-dimethylamino-benzoic acid
N,N-di($\beta$-hydroxyethyl)-p-phenylenediamine
p-(N-ethyl-N-$\beta$-hydroxyethylamino)-o-toluidine
p-Di-$\beta$-hydroxyethylamino-o-chloroaniline
p-Ethylamino-aniline
p-Phenylenediamine
2,5-diethoxy-4-(4'-ethoxyphenylamino)-aniline
p-4-morpholinylaniline
p-1-pipyridylaniline The diazonium compounds derived from the aforesaid aromatic amines can all be used in combination with the previously listed light absorbing components for producing the radiation sensitive photopolymerization catalysts. These aromatic amines and related compounds, which are suitable for practicing the invention, are described in U.S.P. 2,807,545 beginning at the bottom column 3 and continuing on to the top of column 4 down to and including line 18. Such compounds, it is to be noted, are all primary aromatic amines which on diazotization give rise to diazonium salts.

Diazonium compounds derived from the foregoing amines can be employed in the form of their stable diazonium sulfates, chlorobenzene sulfonates or borofluorides or in the form of the double salts of diazonium chloride with zinc chloride, cadmium chloride or stannic chloride.

The diazotization of aromatic amines of the type customarily employed in the manufacture of azo dyes is a well known procedure and comprises generally diazotizing the particular amine with sodium nitrite in the presence of an acid.

Any normally liquid to solid photopolymerizable unsaturated organic compound is suitable in the practice of my invention. Preferably, such compounds should be ethylenically unsaturated, i.e., contain at least one non-aromatic double bond between adjacent carbon atoms. Compounds particularly advantageous are the photopolymerizable vinyl or vinylidene compounds containing a $CH_2{=}C{<}$ group activated by direct attachment to an electro-negative group such as halogen, $C{=}O$, $-C{\equiv}N$, $-C{\equiv}C$, $-O-$. Examples of such photopolymerizable unsaturated organic compounds include acrylamide, acrylonitrile, N-ethanol acrylamide, methacrylic acid, acrylic acid, calcium acrylate, methacrylamide, vinyl acetate, methylmethacrylate, methylacrylate, ethylacrylate, vinyl benzoate, vinyl pyrrolidone, vinylmethyl ether, vinylbutyl ether, vinylisopropyl ether, vinylisobutyl ether, vinylbutyrate, butadiene or mixtures of ethylacrylate with vinyl acetate, acrylonitrile with styrene, butadiene with acrylonitrile and the like.

The above ethylenically unsaturated organic compounds, or monomers as they are sometimes called, may be used either alone or in admixture in order to vary the physical properties such as molecular weight, hardness, etc. of the final polymer. Thus, it is a recognized practice, in order to produce a vinyl polymer of the desired physical properties, to polymerize in the presence of a small amount of an unsaturated compound containing at least two terminal vinyl groups each linked to a carbon atom in a straight chain or in a ring. The function of such compounds is to cross-link the polyvinyl chains. This technique, as used in polymerization, is further described by Kropa and Bradley in vol. 31, No. 12, of Industrial and Engineering Chemistry, 1939. Among such cross-linking agents for the purpose described herein may be mentioned N,N'-methylene-bis-acrylamide, triallyl cyanurate, divinyl benzene, divinyl ketones and diglycol diacrylate. Generally speaking, increasing the quantity of cross-linking agents increases the hardness of the polymer obtained in the range wherein the ratio of monomer to cross-linking agent varies from 10:1 to 50:1.

The photopolymerization as described herein may be employed in numerous modifications and ramifications. Such a system is particularly applicable to imagewise polymerization, as exemplified in the production of relief printing plates for use in the graphic arts. Such plates can be fabricated by coating a mixture of monomer or monomers in a suitable solvent plus a small quantity of diazonium compound and a light absorbing component or dye. The resulting layer is then exposed to an optical image whereby the light-struck areas of the coating undergo polymerization. After removal of the unpolymerized monomer in the unexposed areas, a polymeric relief image remains firmly bonded to the base material. The resist thus formed can be used as a negative working relief plate. By employing a hydrophilic surface as the support for the light sensitive coating such as, for instance, a partially saponified cellulose acetate, a plate is produced having greasy ink receptive and water receptive areas. In this particular instance, it would be necessary to employ a hydrophobic monomer or a monomer that would give rise to a hydrophobic polymer. Such a plate can then be used as a negative working offset plate for the manufacture of printed copies.

Photographic applications of my invention include the production of black and white prints. Thus, a light sensitive plate having coated thereon an unsaturated organic compound in admixture with a diazonium compound and a light absorbing component is exposed beneath an optical image such as a silver negative whereby polymerization occurs in the exposed areas of coating. After removal of the unpolymerized monomer in the unexposed region, there is obtained a reversed polymeric photographic image.

In some instances, it may be desirable to employ a hydrophilic colloid such as the type commonly used in the photographic art. Suitable colloid carriers for this purpose include polyvinyl alcohol, casein, glue, saponified cellulose acetate, carboxymethyl cellulose, starch and the like.

Still another photographic application of my invention is in color reproduction. For instance, a light sensitive plate is prepared as described above, i.e., a base coated with a monomer and a diazonium compound and light absorbing component and exposed to one of the primary color aspects of a subject as represented by color separation negative. After removal of the unpolymerized monomer in the unexposed areas, the polymerized image so obtained is then subtractively dyed. By exposing other light sensitive plates prepared as above to the remaining primary color aspects of the subject, removal of the unpolymerized monomer in the unexposed areas followed by dyeing of the polymerized images with the appropriate subtractively colored dye followed by superposition of the resulting subtractively colored images, a color reproduction of the original subject is thereby obtained.

Other uses to which the above photopolymers may be put include photographic and lithographic applications as, for example, in the production of bimetallic printing plates, edged copper halftone images, printing plates having cellulose ester supports, grained zinc or aluminum lithographic plates, zincated lithographic printing plates, ungrained copper printing plates for preproofing, copper:chromium bimetallic plates, etc.

Various materials are suitable as supports or bases for the radiation sensitive plates prepared in accordance with the process described herein and in this connection reference is made to cellulose ester supports including the hydrophobic variety or the type having a surface made hydrophilic by partial saponification, metals such as aluminum, zinc, brass, copper, stainless steel, terephthalic ester polymers, paper, glass or the like.

A further advantage of my photosensitive coatings and materials arises as a result of their stability so that they are not adversely affected on storage under conditions of excessive humidity and temperature. In this respect, the new materials are superior to the old bichromated glue or albumin layers of the prior art which must be prepared and sensitized just prior to usage because of their poor keeping qualities.

As pointed out immediately above and elsewhere in this description my photosensitive materials have properties, i.e., speed or response to radiation and stability, which make them extremely valuable in the field of photolithography and photography. However, my invention is not restricted to imagewise polymerization but may also readily be applied to bulk polymerization. Such a reaction is carried out by placing a mixture of the desired monomer, diazonium compound and radiation absorbing component in a suitable reactor or container and irradiating the walls thereof with ultraviolet rays, visible light, X-rays, gamma rays or the like. In the event that ultraviolet or visible light is the exciting radiation, the walls of the reactor should, of course, be of glass or similarly transparent material capable of transmitting this type of radiation. If, however, X-ray or gamma radiation is employed, the containing vessel may be of any material permeable thereto such as ceramics, steel, metal and the like.

An important advantage of using my process to effect non-imagewise or bulk polymerization lies in the fact that elevated temperatures are unnecessary. Ordinarily, when polymerization reactions are carried out in the presence of a peroxide catalyst alone, external heat must be applied. However, in my method of bulk polymerization, a reactor is charged with a mixture of monomer diazonium compound and radiation absorbing component and the vessel or container subjected to radiation. Photopolymerization ensues without the need for any external heat. The aforesaid method of polymerization is particularly useful in those applications where it is desired that the polymer conform to the shape and dimensions of the reacting vessel. Such a situation is difficult to achieve when the reacting vessel is of an intricate shape so that the application of heat and stirring in the presence of the conventional peroxide catalyst is rendered impractical. By incorporating my radiation sensitive catalyst in admixture with the monomer and placing in the reaction vessel and irradiated, photopolymerization ensues smoothly and rapidly and evenly throughout the reacting vessel even though the latter be of an odd or unusual shape or configuration.

In addition to light, the photosensitive compositions disclosed herein undergo rapid photopolymerization when exposed to other electromagnetic radiations and in this connection mention is made of infrared rays, ultravoilet rays, gamma rays, X-rays, radioactive emanations and the like. In general, those radiations having a wave length of from $10^{-1}$ centimeters to $10^{-10}$ centimeters will serve to effect photopolymerization of my photosensitive compositions.

A previously pointed out, it is a distinct advantage that the light sensitive compositions as disclosed herein undergo photopolymerization when exposed to low intensity radiation as emanates from an ordinary household incandescent lamp. Consequently, the use of high energy radiation sources such as carbon flame arcs or mercury arcs commonly employed to effect photopolymerization in the prior art processes is unnecessary in my process. Furthermore, my photosensitive materials also possess high speed requiring only a few seconds exposure even with a low wattage incandescent lamp to effect imagewise polymerization. In this respect, my light sensitive compositions are comparable in speed to some silver halide photographic emulsions.

The light sensitivity of the compositions described herein is, as far as I have been able to determine, attributable to the operation of a redox mechanism involving the formation of aryl free radicals when the said compositions are exposed to radiation. In such a mechanism, the diazonium compound functions as an oxidizing agent or electron acceptor whereas the radiation absorbing component, e.g., sensitizing dye, in its excited state (when exposed to radiation) acts as the reducing agent or electron donor.

If such a theory holds true, it would be expected that substances which are efficient absorbers of radiant energy, i.e., dyes having highly mobile electrons which are readily set into oscillation by radiant energy, would produce the most rapid photopolymerization reactions. This has, in fact, proved to be the case.

Furthermore, if the aforesaid mechanism was of the redox type then it should be possible to replace the sensitizing dye which acts as the reducing agent or electron donor in its excited state with a chemical reducing agent and thereby effect polymerization in the absence of light or radiation of any kind. This hypothesis was tested using such well known reducing agents as ascorbic acid, ferrous ions, stannous chloride and hydroquinone. Under these conditions, polymerization proceeded in complete darkness. It is to be noted that hydroquinone ordinarily inhibits or retards polymerization and is actually used as a stabilizer for preventing the polymerization of monomers during storage.

Although it is the applicant's opinion that a redox mechanism involving the formation of aryl free radicals is responsible for the light sensitive properties of the compositions described herein, such a theory is advanced only as an aid in understanding the invention and applicant does not wish to be bound to such a theory in the event it should be later disproved or supplemented.

The following examples illustrate the invention in greater detail although such examples are presented by way of illustration only and are not to be construed as limiting the invention.

EXAMPLE 1

A composition was prepared from the following components:

| | Parts |
|---|---|
| Acrylamide | 180 |
| N,N'-methylene-bis-acrylamide | 7 |
| Water | 120 |

To 2 ml. of this composition was added 10 mg. of p-4-morpholinylbenzenediazonium chloride and 5 drops of a saturated dimethylformamide dye solution of 3-allyl-5-[2-(3-ethyl - 2(3) - benzoxazolylidene)ethylidene]-2-thiohydantoin. The resulting mixture was placed in a 10 x 75 mm. test tube and irradiated with the rays emanating from a 375 watt tungsten lamp situated at a distance of eight inches. After an exposure of 4½ minutes, a solid resinous mass had formed. The photopolymerization was accompanied by a rise in temperature and the evolution of gas bubbles. The latter was presumed to be nitrogen.

EXAMPLE 2

The same procedure was followed as given in Example 1 except that 40 mg. of the p-morpholinylbenzenediazonium chloride was used. The results paralleled those of the first example.

EXAMPLE 3

The procedure was followed as given in Example 1 excepting 10 mg. of p-morpholinylbenzenediazonium chloride was used and the dye solution was 5 drops of a saturated dimethylformamide solution of 3-ethyl-5-[2-(3-ethyl-2(3) - benzoxazolylidene)ethylidene]rhodanine. Polymerization occurred in 6½ minutes.

EXAMPLE 4

The procedure was followed as given in Example 1 except that the dye was 3-allyl-5-[2-(3-ethyl-2(3)benzoxazolylidene) - ethylidene]-1-phenyl-2-thiohydantoin. Polymerization to a tough resinous solid occurred in 5 minutes.

EXAMPLE 5

The procedure was followed as given in Example 1 except that the dye was 3-allyl-5-[(1-ethyl)-2-(3-ethyl-2(3)-benzothiazolylidene)ethylethylidene]rhodanine. Polymerization ensued in 5¾ minutes. The polymer obtained was a tough resinous mass.

EXAMPLE 6

The procedure as given in Example 1 was followed except that the diazonium compound used was 5 mg. of p-diethylaminobenzenediazonium chloride. The results paralleled those of the first example.

EXAMPLE 7

The procedure was followed as in Example 1 except that the dye was 3-carboxymethyl-5-[2-(3-methyl-2(3)-thiazolylidene)-ethylidene]rhodanine. Polymerization occurred in 8½ minutes.

EXAMPLE 8

The procedure of Example 1 was repeated except that the dye was 3-ethyl-5-[2-(3-ethyl-2(3)-benzothiazolylidene)-1-methylethylidene]rhodanine. Polymerization occurred in 7¼ minutes.

EXAMPLE 9

The procedure of Example 1 was followed except that the dye was 4-carboxy-3-[2-(3-ethyl-2(3H)-benzothiazolylidene)ethylidene] - 6-hydroxy-2(1)-pyridone. Polymerization occurred in 4½ minutes with the formation of a tough resin.

EXAMPLE 10

The same procedure was followed as given in Example 1 except that the dye was 3,3'-diethyl-2,2'-cyanine iodide. Polymerization occurred in 6 minutes with the formation of a hard plastic solid.

EXAMPLE 11

The same procedure was followed as given in Example 1 except that the dye was 2-p-dimethylaminostyrylbenzothiazole. Polymerization to a resinous solid ensued in 5¾ minutes.

EXAMPLE 12

The same procedure was followed as given in Example 1 except that the diazonium compound was 30 mg. of p-1 - piperidylbenzenediazonium chloride. Polymerization occurred with the formation of a tough resinous solid.

EXAMPLE 13

The same procedure was employed as presented in Example 1 except that the dye was 3,3'-diethyl-9-methylthiacarbocyanine iodide. The results were essentially the same as obtained in the first example.

EXAMPLE 14

The same procedure was employed as given in Example 1 except that the dye was 3,3′,9-triethyl-5,5′-diphenyloxacarbocyanine iodide. Polymerization ensued in 7¼ minutes to a tough resin.

EXAMPLE 15

The same procedure was followed as given in the preceding example except that 30 mg. of 2,5-diethoxy-4-(4′-ethoxyphenylamino)benzene diazonium was used. The results paralleled those of Example 14.

EXAMPLE 16

The same procedure was employed as presented in Example 1 except that the dye was an oxanol of the following formula:

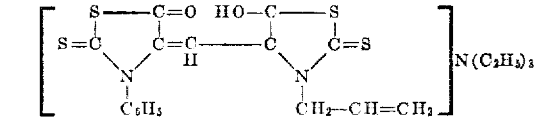

Polymerization to a tough plastic mass occurred in 6 minutes.

EXAMPLE 17

The same procedure was carried out as given in Example 1 except that the dye was 3-ethyl-3′,5,6-trimethyloxathiazolocarbocyanine iodide. Polymerization to a resinous mass occurred in 5¾ minutes.

EXAMPLE 18

The same procedure was followed as given in the previous example except that the diazonium compound was 50 mg. of p-ethylaminobenzenediazonium chloride. The results were essentially identical to those obtained in Example 17.

EXAMPLE 19

The same procedure was followed as given in Example 1 except that the dye was 4-carboxy-3-[2-(3-ethyl-2-(3)-benzothiazolylidene)ethylidene]-6-hydroxy-2(1)-pyridone. Polymerization took place in 6¾ minutes with the formation of a tough polymerized solid.

EXAMPLE 20

The same procedure was employed as given in Example 1 except that the dye was an azo dye obtained by coupling diazotized p-diethylaminoaniline with N-(β-hydroxyethyl)-α-resorcylamide. Polymerization occurred in 6 minutes with the formation of a tough plastic mass.

EXAMPLE 21

The same procedure was employed as given in Example 1 except that the dye was an azo dye obtained by coupling diazotized p-dimethylamino-o-toluidine with resorcinol. The results paralleled those of the previous example.

EXAMPLE 22

The same procedure was employed as given in Example 1 except that the dye was an azo dye obtained by coupling diazotized 4-hydroxyaniline with 1-(3′-carboxyphenyl)-3-undecyl-5-pyrazolone. The results obtained in this case paralleled those of Example 20.

EXAMPLE 23

The same procedure was followed as given in Example 1 except that the dye was an azo dye obtained by coupling diazotized 2-ethoxy-4-diethylaminoaniline with 3-(p-stearoylamidobenzoylacetamido)isophthalic acid. The results in this experiment are essentially the same as those obtained in the case of Example 20.

EXAMPLE 24

The same procedure was followed as given in Example 1 excepting that 25 ml. of p-4-morpholinylbenzenediazonium chloride was used. The results obtained in this case paralleled those of the previous example.

The amount of diazonium compound used in combination with the dye to effect photopolymerization as described above is not critical. Thus, I have employed quantities of diazonium compounds ranging from 5 mg. to 50 mg. per 2 ml. of monomer composition of Example 1. In all instances wherein experiments were carried out with the aforesaid concentrations, rapid photopolymerization took place. Since the light absorbing components or dyes used in conjunction with the light sensitive diazonium compounds tend to be rather insoluble in the dimethylformamide solvent, I always employed saturated solutions. As would be expected, however, such solutions did not always contain the same concentration of dye due to differences in solubility of the particular dye. It is believed to be manifest, therefore, that the concentration of dye is not critical and may vary over wide limits.

EXAMPLE 25

A composition was prepared having the following components:

| | | |
|---|---|---|
| Gelatin (15% by weight aqueous solution) | ml. | 15 |
| Monomer solution of Example 1 | ml. | 3 |
| p-4-morpholinylbenzenediazonium chloride | mg. | 30 |
| 3-allyl-5-[2-(3-ethyl-2(3)-benzoxazolylidene-ethylidene]-2-thiohydantoin; saturated solution in dimethylformamide | drops | 7 |

The above composition was coated on an aluminum plate and allowed to dry. The dried coating was then exposed for 30 seconds through a silver negative to a 375 watt tungsten lamp placed at a distance of 30 inches. The plate was next washed with water to remove the unpolymerized monomer in the unexposed areas. A polymeric relief image corresponding to the irradiated areas remained firmly bonded to the aluminum base.

The above example is illustrative of the manner in which the photosensitive compositions of the type disclosed herein can be used for the production of photographic polymeric relief images. Any of the photosensitive compositions contained in the preceding examples or otherwise mentioned herein can also be employed in this manner.

I claim:

1. A process for photopolymerizing a normally liquid to normally solid monomer containing the grouping $CH_2=C<$ attached directly to an electronegative group which comprises exposing the said monomer to electromagnetic radiation having a wave length extending from the ultraviolet through the visible region, in the presence of a catalyzing mixture consisting essentially of (1) a light-sensitive aromatic diazonium compound and (2) a dye selected from the class consisting of azo dyes, cyanine dyes, azanol dyes, oxanol dyes, styryl dyes, hemicyanine dyes and merocyanine dyes said mixture being the sole catalyst for the photopolymerization.

2. The process as defined in claim 1 wherein the dye is an azo dye.

3. The process as defined in claim 1 wherein the dye is a cyanine dye.

4. The process as defined in claim 1 wherein the dye is a merocyanine.

5. The process as defined in claim 1 wherein the dye is an azanol.

6. The process as defined in claim 1 wherein the dye is an oxanol.

7. The process as defined in claim 1 wherein the dye is a styryl.

8. The process as defined in claim 1 wherein the dye is a hemicyanine.

9. The process as defined in claim 1 wherein the electromagnetic radiation is visible light.

10. The process as defined in claim 1 wherein is added to the polymerizable compound a cross-linking agent having at least two terminal vinyl groups.

11. The process as defined in claim 10 wherein the crosslinking agent is selected from the class consisting of N,N′-methylene-bis-acrylamide, triallyl cyanurate, divinyl benzene, divinyl ketones and diglycol diacrylate.

12. A process of producing by photopolymerization a polymeric photographic image which comprises irradiating to electromagnetic radiation having a wave length extending from the ultraviolet through the visible region, a photographic element comprising a support having thereon a radiation sensitive layer comprising a normally liquid to normally solid monomer containing the grouping $CH_2{=}C<$ attached directly to an electronegative group and a colloid carrier therefor and as the sole catalyst for said photopolymerization a mixture consisting essentially of (1) a light-sensitive aromatic diazonium compound and (2) a dye selected from the class consisting of azo dyes, cyanine dyes, azanol dyes, oxanol dyes, styryl dyes, hemicyanine dyes and merocyanine dyes, thereby polymerizing the monomer in the exposed areas, and then removing the residual monomer in the unexposed areas by washing.

13. A radiation sensitive photographic element comprising a support and having thereon a light-sensitive layer comprising a mixture of a normally liquid to normally solid monomer containing the grouping $CH_2{=}C<$ directly to an electronegative group, a photographic colloid carrier therefor, and as the sole photopolymerization catalyst a mixture consisting essentially of (1) a light-sensitive aromatic diazonium compound and (2) a dye selected from the class consisting of azo dyes, cyanine dyes, azanol dyes, oxanol dyes, styryl dyes, hemicyanine dyes and merocyanine dyes.

14. A process as defined in claim 12 wherein the colloid carrier is gelatin.

15. A process as defined in claim 12 wherein is added to the polymerizable vinyl compound a cross-linking agent having at least two terminal vinyl groups.

16. A process as defined in claim 12 wherein the cross-linking agent is selected from the class consisting of N,N'-methylene-bis-acrylamide, triallyl cyanurate, divinyl benzene, divinyl ketones and diglycol diacrylate.

17. The process as defined in claim 12 wherein the exposing radiation is visible light.

18. The element as described in claim 13 wherein the photographic colloid carrier is gelatin.

19. The element as described in claim 13 wherein the polymerizable compound contains a cross-linking agent having at least two terminal vinyl groups.

20. The element as described in claim 19 wherein the cross-linking agent is selected from the class consisting of N,N'-methylene-bis-acrylamide, triallyl cyanurate, divinyl benzene, divinyl ketones and diglycol diacrylate.

References Cited in the file of this patent

UNITED STATES PATENTS

| | | |
|---|---|---|
| 2,397,866 | McQueen | Apr. 2, 1946 |
| 2,666,701 | West | Jan. 19, 1954 |
| 2,875,047 | Oster | Feb. 24, 1959 |
| 2,996,381 | Oster et al. | Aug. 15, 1961 |
| 3,038,800 | Luckey et al. | June 12, 1962 |

FOREIGN PATENTS

| | | |
|---|---|---|
| 1,055,814 | Germany | Apr. 23, 1959 |

UNITED STATES PATENT OFFICE
CERTIFICATE OF CORRECTION

Patent No. 3,099,558 July 30, 1963

Steven Levinos

It is hereby certified that error appears in the above numbered patent requiring correction and that the said Letters Patent should read as corrected below.

Column 4, line 7, for "12-acetoxy3,3′" read -- 12-acetoxy-3,3′ --; line 54, for "3-carboxymethyl-5-[(3-methyl-2(3)-thiazolinylidene)-2-" read -- 3-carboxymethyl-5-[(3-methyl-2(3)-thiazolinylidene) --; line 56, for "3-ethyl-5-[4-3-β-phenoxyethyl-2(3)-benzothizolylidene)-2-" read -- 3-ethyl-5-[4-(3-β-phenoxyethyl-2(3)-benzothiazolylidene)-2- --; column 4, line 72, for "3-ethyl-5-[6-ethyl-4-phenyl-2(3)-thiazolylidene)-2,4-" read -- 3-ethyl-5-[6-(3-ethyl-4-phenyl-2(3)-thiazolylidene)-2,4- --; column 5, lines 73 to 75, the formula should appear as shown below instead of as in the patent:

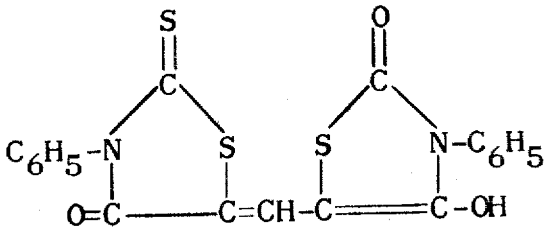

column 6, lines 1 to 5, the formula should appear as shown below instead of as in the patent:

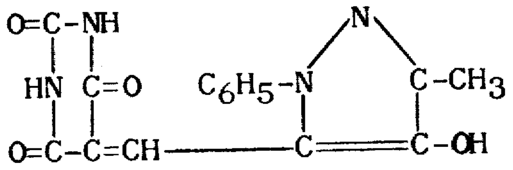

column 6, lines 21 to 27, the formula should appear as shown below instead of as in the patent:

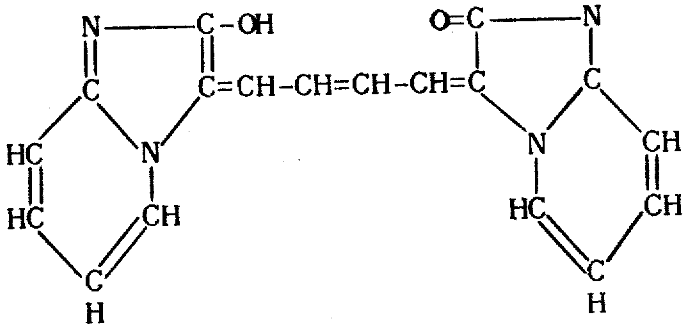

column 7, line 8, for "6-methoxy-1-methy-2-m-nitrostyryl-quinolinium bromide" read -- 6-methoxy-1-methyl-2-m-nitro-styrylquinolinium bromide --; column 7, line 21, for "1-(3′-stearylaminophenyl)-3-methyl-5-pyrazolone" read -- 1-(3′-sulfomethylenephenyl)-3-heptadecyl-5-pyrazolone --; column 8, line 43, after "bottom" insert -- of --; column 11, line 4, for "A" read -- As --; column 14, line 19, for "3-allyl-5-[2-(3-ethyl-2(3)-benzoxazolylidene-" read -- 3-allyl-5-[2-(3-ethyl-2(3)-benzoxazolylidene-) --; same column 14, line 71, for "crosslinking" read -- cross-linking --.

Signed and sealed this 28th day of July 1964.

(SEAL)
Attest:

ESTON G. JOHNSON
Attesting Officer

EDWARD J. BRENNER
Commissioner of Patents

UNITED STATES PATENT OFFICE
CERTIFICATE OF CORRECTION

Patent No. 3,099,558 July 30, 1963

Steven Levinos

It is hereby certified that error appears in the above numbered patent requiring correction and that the said Letters Patent should read as corrected below.

Column 4, line 7, for "12-acetoxy3,3'" read -- 12-acetoxy-3,3' --; line 54, for "3-carboxymethyl-5-[(3-methyl-2(3)-thiazolinylidene)-2-" read -- 3-carboxymethyl-5-[(3-methyl-2(3)-thiazolinylidene) --; line 56, for "3-ethyl-5-[4-3-β-phenoxyethyl-2(3)-benzothizolylidene)-2-" read -- 3-ethyl-5-[4-(3-β-phenoxyethyl-2(3)-benzothiazolylidene)-2- --; column 4, line 72, for "3-ethyl-5-[6-ethyl-4-phenyl-2(3)-thiazolylidene)-2,4-" read -- 3-ethyl-5-[6-(3-ethyl-4-phenyl-2(3)-thiazolylidene)-2,4- --; column 5, lines 73 to 75, the formula should appear as shown below instead of as in the patent:

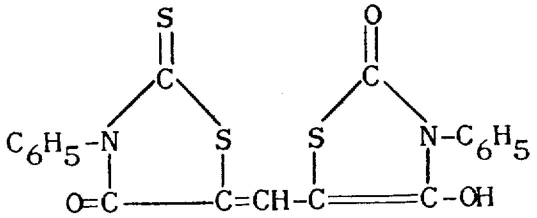

column 6, lines 1 to 5, the formula should appear as shown below instead of as in the patent:

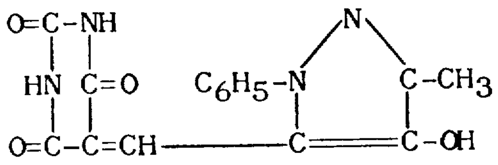

column 6, lines 21 to 27, the formula should appear as shown below instead of as in the patent:

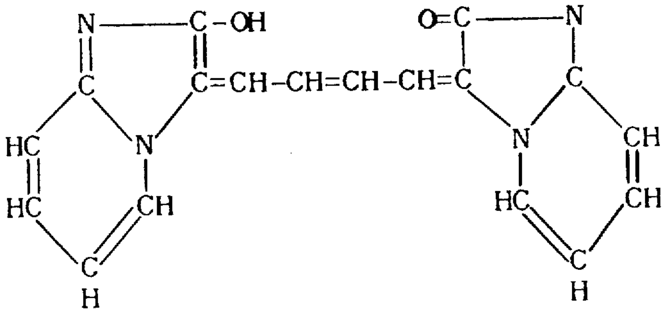

column 7, line 8, for "6-methoxy-1-methy-2-m-nitrostyrylquinolinium bromide" read -- 6-methoxy-1-methyl-2-m-nitrostyrylquinolinium bromide --; column 7, line 21, for "1-(3'-stearylaminophenyl)-3-methyl-5-pyrazolone" read -- 1-(3'-sulfomethylenephenyl)-3-heptadecyl-5-pyrazolone --; column 8, line 43, after "bottom" insert -- of --; column 11, line 4, for "A" read -- As --; column 14, line 19, for "3-allyl-5-[2-(3-ethyl-2(3)-benzoxazolylidene-" read -- 3-allyl-5-[2-(3-ethyl-2(3)-benzoxazolylidene-) --; same column 14, line 71, for "crosslinking" read -- cross-linking --.

Signed and sealed this 28th day of July 1964.

(SEAL)
Attest:

ESTON G. JOHNSON
Attesting Officer

EDWARD J. BRENNER
Commissioner of Patents